United States Patent [19]

Ogura

[11] Patent Number: 4,918,482
[45] Date of Patent: Apr. 17, 1990

[54] IMAGE FORMING APPARATUS
[75] Inventor: Mitsuru Ogura, Nara, Japan
[73] Assignee: Sharp Kabushiki Kaisha, Osaka, Japan
[21] Appl. No.: 248,775
[22] Filed: Sep. 23, 1988
[30] Foreign Application Priority Data Oct. 14, 1987 [JP]  Japan .................. 62-259272

[51] Int. Cl.$^4$ .................. G03B 27/32; G03B 27/52
[52] U.S. Cl. .................. 355/27; 271/280; 355/72
[58] Field of Search ............. 271/280, 281, 282, 303; 355/27, 72; 430/138

[56] References Cited

U.S. PATENT DOCUMENTS

| | | | |
|---|---|---|---|
| 3,542,361 | 11/1970 | Call | 271/280 |
| 3,984,097 | 10/1976 | Touchette | 271/280 |
| 4,399,209 | 8/1983 | Sanders et al. | 430/138 |
| 4,624,560 | 11/1986 | Beery | 355/27 |
| 4,806,982 | 2/1989 | Yamamoto et al. | 355/27 |

Primary Examiner—Richard A. Wintercorn
Attorney, Agent, or Firm—Flehr, Hohbach, Test, Albritton & Herbert

[57] ABSTRACT

An image forming apparatus superposes an image receiving sheet on a light receiving sheet and presses them together such that a selectively hardened image formed on the light receiving sheet is transferred to the image receiving sheet to form a visible image. The used portion of the light receiving sheet is wound up around a take-up shaft after separated from the image receiving sheet by means of a separator. A retracting mechanism is provided to the separator such that the separator is retracted from the normal position on the travel path of the light receiving sheet when the front end of the light receiving sheet is initially wound around the take-up shaft.

7 Claims, 4 Drawing Sheets

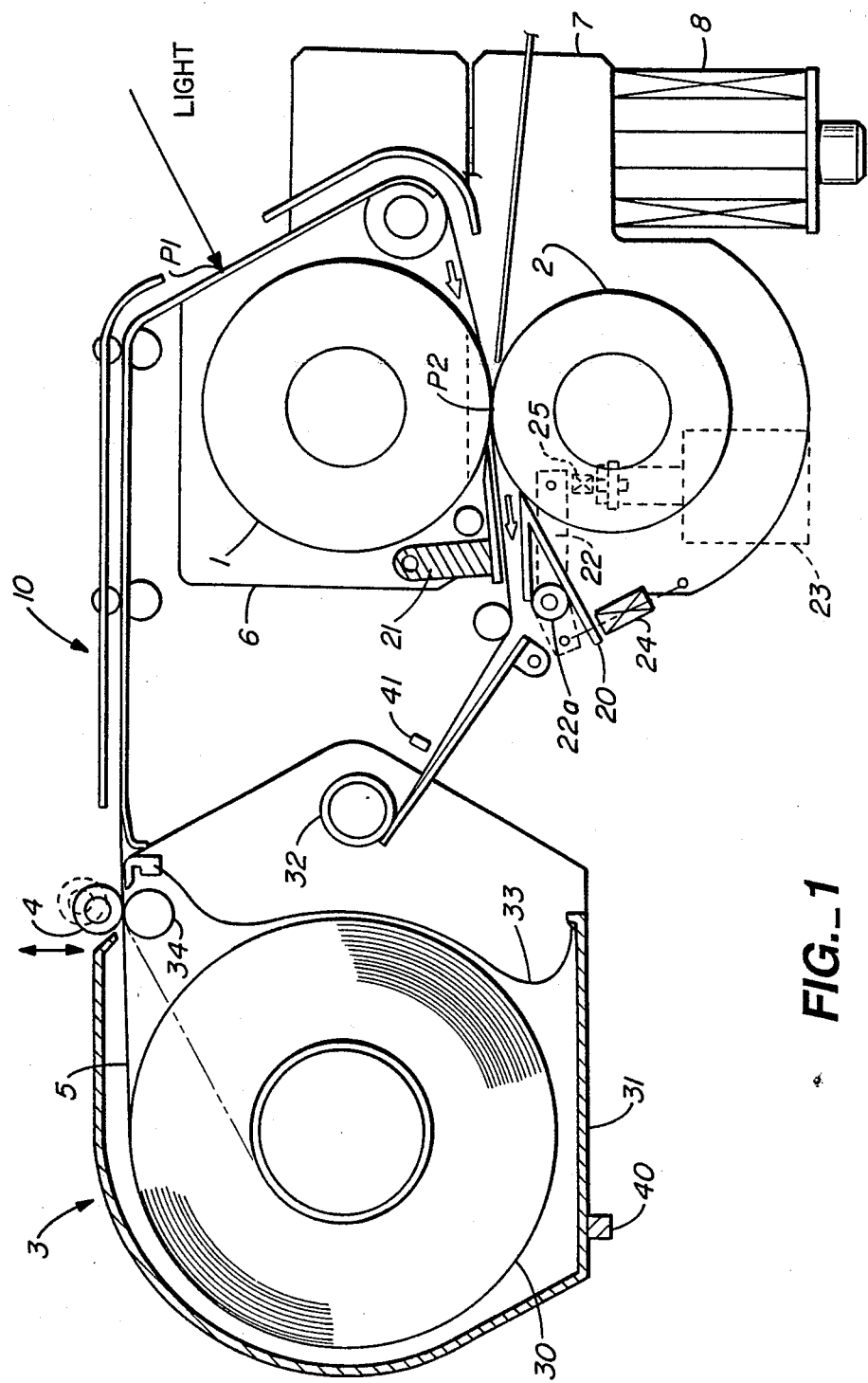
FIG._1

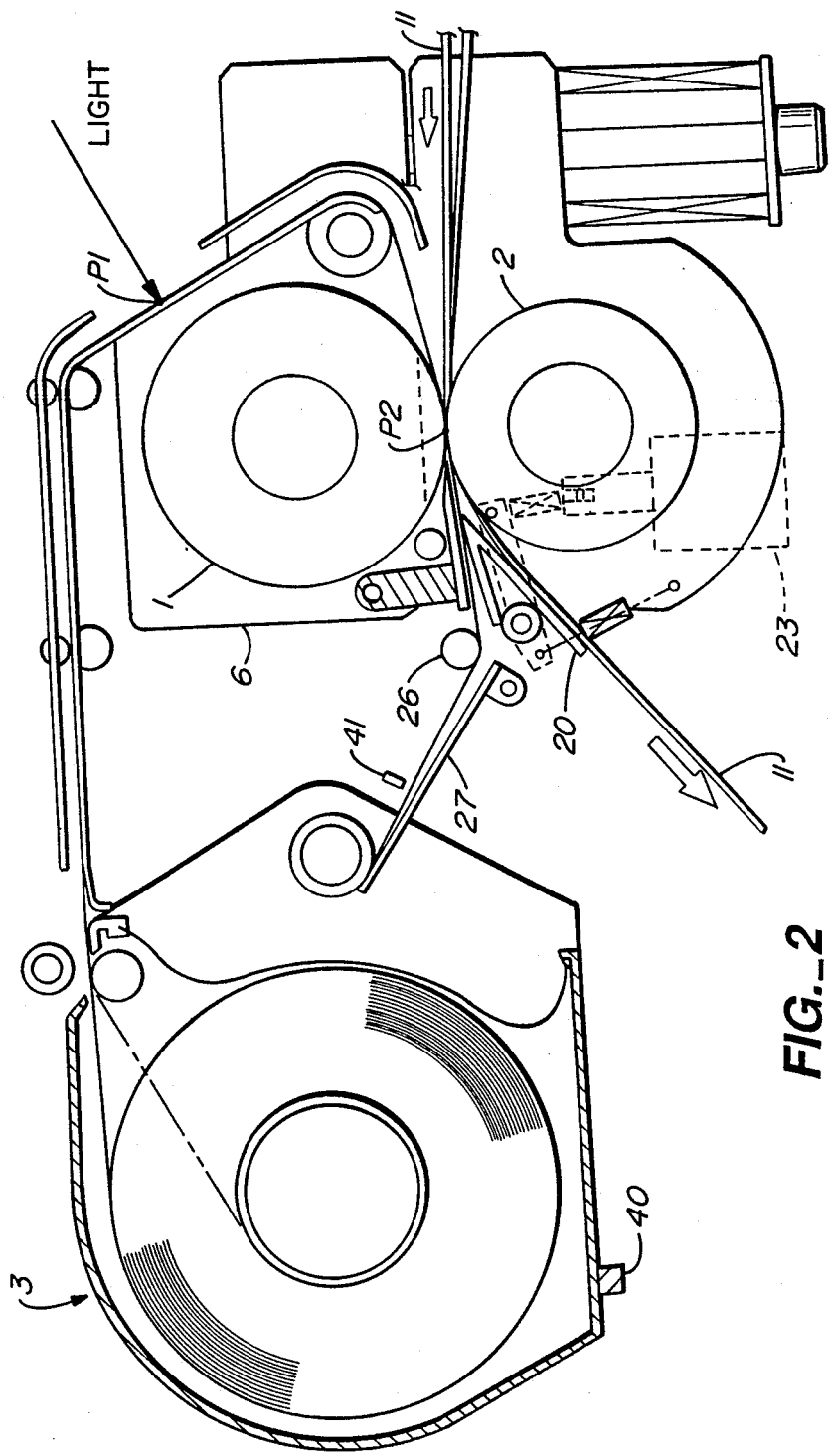
FIG._2

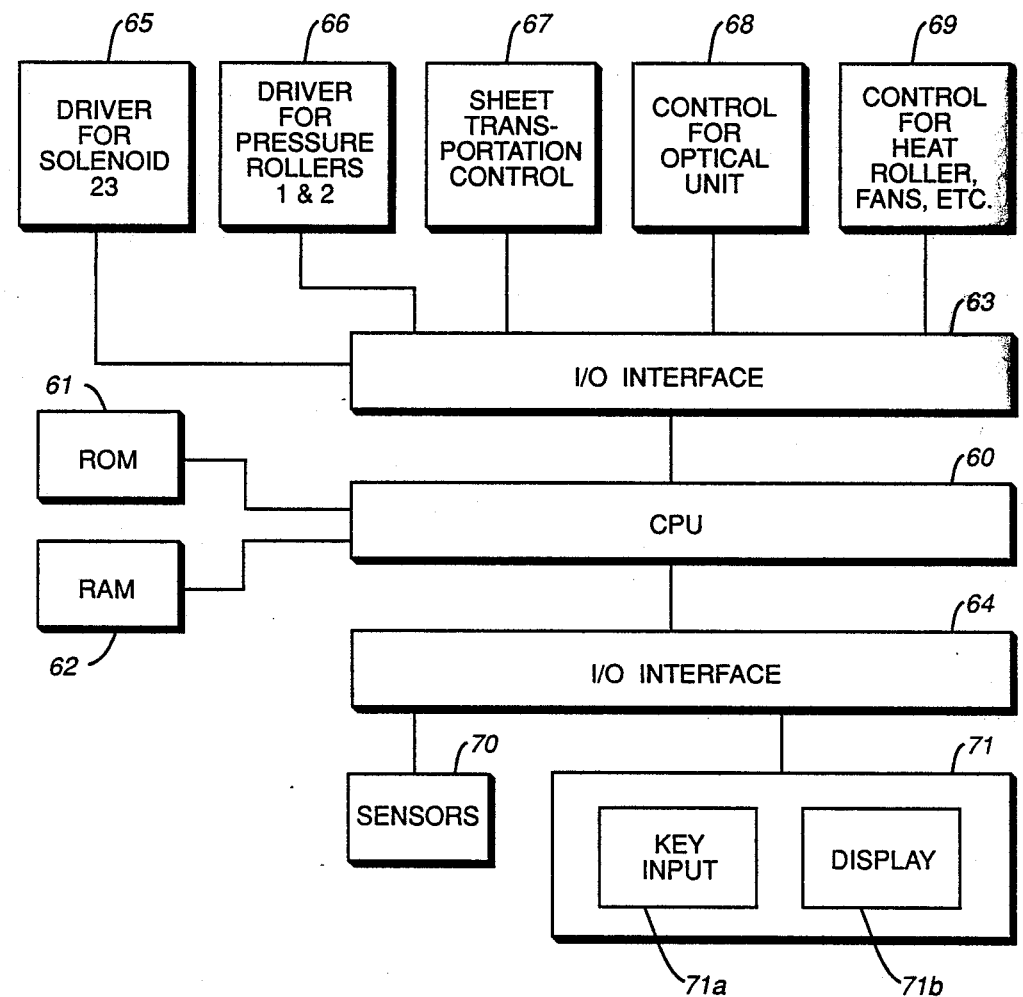
FIG._3

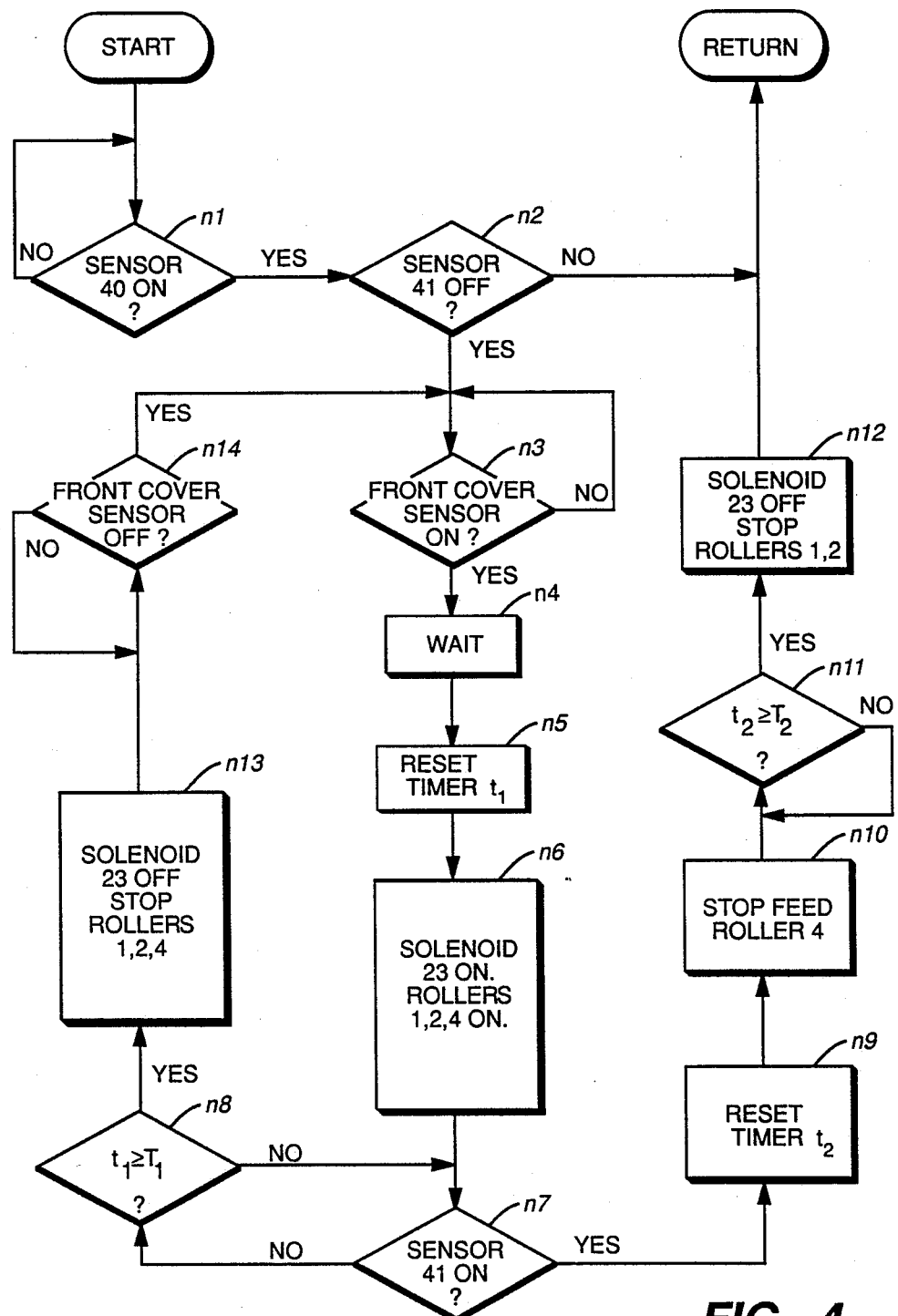
FIG._4

IMAGE FORMING APPARATUS

BACKGROUND OF THE INVENTION

This invention relates to an image forming apparatus which forms an image by superposing an image receiving sheet on a light receiving sheet comprising a photosensitive film on which a selectively hardened image is formed.

A light receiving sheet which may be used for such an image forming apparatus has been disclosed, for example, in Japanese Patent Publication Tokkai 58-88739. Such a sheet is formed by coating the surface of a flexible base material with pressurerupturable microcapsules encapsulating a colorless dye and a photopolymerizable substance as an example of substance which hardens by exposure to light and a selectively hardened image can be formed on such a sheet by exposing it to an image carrying beam of light. In other words, if an image carrying beam of light such as a reflected beam of light from an original document to be copied is made incident on such a light receiving sheet, only those of the microcapsules exposed to light are hardened and there results as a whole a pattern, or image, formed by selectively hardened microcapsules. In order to form a visible image from such a pattern, or image, formed on the light receiving sheet, an image receiving sheet coated with a developing agent is superposed on the image carrying sheet and they are pressed together. As a result of this compression process, those of the microcapsules which were not hardened are ruptured and the colorless dye encapsulated therein flows out, causing a chromogenic reaction with the developing agent with which the surface of the image receiving sheet is coated and thereby forming a visible image of the original to be copied.

When a light receiving sheet is used in connection with such an image forming apparatus, it is extremely important to prevent external light from being made incident thereon and external force from being applied thereon before it reaches the so-called exposure point where it is intentionally exposed to the image carrying bean of light reflected from an original. The reason for the latter is that the microcapsules may otherwise rupture by a carelessly applied external force. One method of protecting the unused light receiving sheet from external light and force is to prepare it in the form of a roll and preliminarily set such a roll inside a container and to wind it up after the image formed thereon has been transferred to an image receiving sheet as described above. One advantage of this method is that the light receiving sheet can be wrapped directly around a drum-like cylindrical structure on which the aforementioned exposure point is defined such that the light receiving sheet can be supplied and removed by the rotation of this cylindrical structure and hence that feed rollers and guide rollers of the kind required if the sheets are to be supplied from a tray can be dispensed with. Moreover, since the used sheets can be taken up and stored internally, images containing confidential information, for example, can be more easily controlled and the used sheets can be removed more expediently.

After two sheets are superposed one on top of the other and pressed together to transfer an image from one to the other, they must be separated from each other. A means for this purpose (hereinafter generally referred to as a sheet separator) is generally disposed behind the transfer position where the sheets are pressed together and the image is transferred from one to the other. If the image forming apparatus is adapted to wind up the used portions of the light receiving sheet, the front end (the leader section) of the originally rolled sheet is preliminarily wound around a take-up shaft. If the sheet separator is disposed at a fixed position in such an apparatus, however, the process of initially attaching the leader section of the light receiving sheet to the take-up shaft becomes difficult to perform. If the apparatus is of the kind which causes the leader section of the light receiving sheet to be automatically pulled out of its container (cartridge) after it is set inside the apparatus and passed through the transfer position to the take-up shaft, in particular, the sheet separator at a fixed position tends to interfere with the forward movement of the leader section and to cause a jam.

SUMMARY OF THE INVENTION

It is therefore an object of the present invention to eliminate the aforementioned problems associated with prior art image forming apparatus of the type having a sheet separator disposed at a fixed position.

An image forming apparatus embodying the present invention with which the above and other objects can be achieved is characterized as having a means for retracting the sheet separator from the path along which the light receiving sheet is transported. With such a retracting means, the sheet separator can be retracted from its normal position when it is not convenient to have it positioned there such as when the leader section of the light receiving sheet is being wound up around the take-up shaft.

When the leader section of a light receiving sheet from a cartridge is wound around the take-up shaft in an image forming apparatus thus structured, its sheet separator is retracted from the path of the leader section such that the leader section, after passing the transfer position where the light receiving and image receiving sheets are pressed together, can be easily directed to and wound around the take-up shaft because the sheet separator is not in the way. After the leader section has been securely wound around the take-up shaft, the sheet separator is returned to its normal position on the path along which the light receiving sheet travels such that the light receiving and image receiving sheets can be easily separated from each other during an image forming process.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIGS. 1 and 2 are sectional views of a portion of an image forming apparatus embodying the present invention when its sheet separator is in a retracted position in a normal position, respectively, FIG. 3 is a block diagram of the control unit of the image forming apparatus shown in FIGS. 1 and 2, and FIG. 4 is a flow chart showing the operation of the control unit shown in FIG. 3 when a cartridge is initially set.

DETAILED DESCRIPTION OF THE INVENTION

FIG. 1 shows a relevant portion of an image forming apparatus which employs as photoreceptor a light receiving sheet with a flexible base sheet coated with microcapsules encapsulating therein a colorless dye and a photocurable agent (hardening by exposure to light). The light receiving sheet is stored in the form of a roll inside a cartridge which is adapted to be set inside the image forming apparatus.

Approximately at the center of the housing, the image forming apparatus has an upper pressure roller 1 and a lower pressure roller 2 below the upper pressure roller 1. A cartridge 3 with a housing 31 containing a roll 30 of light receiving sheet 5 is removably attached to the left of the upper pressure roller 1. The cartridge 3 is also comprised of a take-up shaft 32, a flexible partitioning sheet 33 separating the cartridge housing 31 from the take-up shaft 32 and an outlet roller 34.

The image forming apparatus is provided with a feed roller 4 with a vertically movable axis. When the cartridge 3 is set inside the image forming apparatus as shown in FIG. 1, its outlet roller 34 assumes a position opposite to this feed roller 4. If the feed roller 4 is lowered, the front end of the leader section of the light receiving sheet 5 is sandwiched from both sides between the outlet roller 34 of the cartridge 3 and the feed roller 4 such that the driving force of the feed roller 4 is communicated to the light receiving sheet 5 to pull it out of the cartridge.

The upper and lower pressure rollers 1 and 2 are respectively affixed to upper and lower holders 6 and 7. The lower holder 7 is pressed against the upper holder 6 by means of a biasing spring 8 such that the upper and lower pressure rollers 1 and 2 are strongly compressed with each other at a pressure point $P_2$.

Pulled by the rotary force of the feed roller 4 on its leader section as explained above, the light receiving sheet 5 is led out of the cartridge 3, passes the exposure point P1 and the pressure point $P_2$ and is wound up around the take-up shaft 32 of the cartridge 3. As will be explained more fully below, when the cartridge 3 is set inside the apparatus and its front cover is closed, the feed roller 4 automatically presses the leader section at the front end of the light receiving sheet 5 against the outlet roller 34 and starts rotating to pull it out of the cartridge 3 until its leader section is wound around the take-up shaft 32. After the leader section is wound around the take-up shaft 32, the feed roller 4 is automatically moved upward to be separated from the light receiving sheet 5 so as no longer to apply any pressure on the photosensitive microcapsule-coated part of the light receiving sheet 5 which follows the leader section. At the same time, the rotary motion of the feed roller 4 is stopped. The leader section is thus provided for the purpose of being pulled by the feed roller 4 and led to the take-up shaft 32 as explained above and is therefore made of a somewhat stiff material and is not coated with microcapsules. At the moment when the leader section is wound around the take-up shaft 32 and the feed roller 4 is stopped and lifted, the microcapsule-coated surface of the light receiving sheet 5 is at the exposure point $P_1$. In other words, the image forming apparatus is now ready to form an image by exposing the light receiving sheet 5 to a beam of image carrying beam of light reflected from an original document to be copied.

To the left of the pressure point $P_2$ are a wedge-shaped sheet separator 20 and a guide piece 21 for guiding the light receiving sheet 5 passing through the pressure point $P_2$. The sheet separator 20 is attached to a lever 22 which is rotatably supported around an axis 22a. The right-hand end of the lever 22 is attached to one end of a spring 25 of which the other end is attached to a solenoid 23. The left-hand end of the lever 22 is attached to another spring 24.

During an image forming process, the solenoid 23 is not activated such that the spring 25 at the right-hand side of the lever 22 is elongated as shown in FIG. 2 and the sheet separator 20 rotates in the counter-clockwise direction around the axis 22a until its wedge-like pointed end rests on the path of the light receiving sheet 5. With the sheet separator 20 thus positioned as shown in FIG. 2, the light receiving sheet 5 and an image receiving sheet 11 which were pressed together at the pressure point $P_2$ between the upper and lower pressure rollers 1 and 2 are thereby separated upward and downward, respectively. The image receiving sheet 11 is thereafter led to the lower left-hand side and the light receiving sheet 5 is guided not only by the guide piece 21 but also by other guiding means (a guide roller 26 and a guide plate 27 as indicated in FIG. 2) to be wound around the take-up shaft 32.

When the cartridge 3 is initially set inside the image forming apparatus and the leader section of the light receiving sheet is transported past the exposure and pressure points $P_1$ and $P_2$ to the take-up shaft 32 as explained above, on the other hand, the solenoid 23 is switched on, causing the right-hand end of the lever 22 to be pulled by the spring 25 as shown in FIG. 1 such that the wedge-like pointed front end of the sheet separator 20 is retracted from its normal position on the traveling path of the light receiving sheet 5. When the front end of the leader section is transported past the pressure point $P_2$, therefore, the sheet separator 20 is not there to block its forward advance and the leader section can smoothly pass by the sheet separator 20 to the take-up shaft, guided by the guiding means 21, 26 and 27 as explained above in connection with FIG. 2. After the leader section is wound around the take-up shaft 32, the solenoid 23 is switched off and the situation depicted in FIG. 2 is restored. By this time, the feed roller 4 is stopped and the light receiving sheet 5 is no longer advancing. In summary, with the sheet separator 20 thus made retractable, possibility of a jam can be significantly reduced.

In FIGS. 1 and 2, numerals 40 and 41 respectively indicate a cartridge sensor for detecting whether the cartridge 3 has been properly set inside the apparatus and a sheet sensor for detecting the position of the front end of the leader section. In addition, the apparatus is also provided with a front cover sensor (not shown) for detecting whether the front cover (not shown) of the apparatus has been properly closed. These sensors are collectively shown at 70 in the block diagram of FIG. 3 showing the control unit of the apparatus shown in FIGS. 1 and 2 and their output signals are received through an input-output interface circuit 64 by a central processing unit CPU 60. The CPU 60 is also connected to a read-only memory 61, a random-access memory 62 and another input-output interface circuit 63. Further connected to the interface circuit 63 are a driver means 65 for the solenoid 23, a driver means 66 for the upper and lower pressure rollers 1 and 2, a control unit 67 for controlling the transportation of the image receiving sheet, a control unit 68 for the optical system (not shown) of the image forming apparatus and another control unit 69 for controlling other components such as fans and a heat roller. The interface circuit 64 is also connected to a control panel 71 which includes a key input section 71a and a display section 71b.

The operation of the CPU 60 when a new cartridge 3 is set in the apparatus is explained next with reference to the flow chart of FIG. 4. After the front cover of the apparatus is opened, the CPU 60 waits until the cartridge sensor 40 detects the insertion of a cartridge (n1). If the presence of a cartridge is detected, the CPU 60 next examines whether the sheet sensor 41 is on or off (n2). If it is on, it means that the detected cartridge is not a newly inserted one and hence there is no need to pull out the light receiving sheet and to wind its leader section around the take-up shaft. In this case, the program skips to the end. If the detected cartridge is a newly inserted one, the sheet sensor 41 must be off. Then, the CPU 60 waits until the front cover of the apparatus is closed (n3) and advances to Step n4. Alternatively, the control unit may be so programmed that the CPU 60 does not use the closing of the front cover as the condition for advancing to Step n4 but directly advances to Step n4 as soon as the cartridge sensor 40 is switched on in Step n1.

After a preset period of time such as 1-2 seconds (n4), a timer $t_1$ assigned in the RAM 62 is reset (n5). Thereafter, the solenoid 23 is switched on, and the feed roller 4 and the upper and lower pressure rollers 1 and 2 are activated (n6). This causes the front end of the leader section of the light receiving sheet 5 to be pulled out of the cartridge 3, travel past the exposure and pressure points $P_1$ and $P_2$ and be wound around the take-up shaft 32 as explained above. If the sheet sensor 41 fails to detect the front end of the leader section within a predetermined length of time $T_1$ after the timer t1 was set (NO in n7 and YES in n8), this means that the light receiving sheet 5 was not properly pulled out of the cartridge 3 or otherwise causing a jam inside the apparatus. Thus, the solenoid 23 is switched off and the feed roller 4 and the upper and lower pressure rollers 1 and 2 are all stopped (n13) and after it is ascertained that the front cover is opened (n14), the program is restarted.

If the sheet sensor 41 detects the arrival of the leader section in a timely manner, another timer $t_2$ is reset (n9) and the feed roller 4 is stopped. After another predetermined length of time $T_2$ has passed (n11), the solenoid 23 is switched off and the upper and lower pressure rollers 1 and 2 are stopped (n12). The time length $T_2$ represents the time required for the leader section to be completely wound around the take-up shaft 32.

With the image forming apparatus thus programmed, a new cartridge of light receiving sheet can be set easily and dependably because not only is the leader section automatically pulled out and wound around the take-up shaft but the sheet separator is also automatically retracted so as not to block its forward motion.

The foregoing description of a preferred embodiment of the invention was presented for purposes of illustration and description. It is not intended to be exhaustive or to limit the invention to the precise form disclosed, and many modifications and variations are possible in light of the above teaching. For example, the present invention is equally applicable to an image forming apparatus requiring the leader section to be wound around the take-up shaft manually. Any modifications and variations that may be apparent to a person skilled in the art are intended to be within the scope of this invention.

What is claimed is:

1. In an image forming apparatus for forming a visible image by superposing an image receiving sheet on a light receiving sheet, said light receiving sheet having a selectively hardened image formed thereon and pressing said sheets together to transfer said selectively hardened image onto said image receiving sheet, said apparatus including take-up means for causing said light receiving sheet to travel along a take-up path to be wound up around a take-up shaft, the improvement wherein said image forming apparatus further includes
    a separator disposed normally on said take-up path for separating said image receiving sheet from said light receiving sheet after said image is transferred,
    retracting means for retracting said separator from said take-up path, and
    a control unit which activates said retracting means after ascertaining that a new cartridge containing unused light receiving sheet has been inserted into said apparatus.

2. The image forming apparatus of claim 1 wherein said separator has a wedge-like front end.

3. The image forming apparatus of claim 2 wherein said separator is rotatably supported and is attached to a biasing means which tends to normally keep said wedge-like front end of said separator on said take-up path.

4. The image forming apparatus of claim 3 wherein said retracting means include a solenoid which, when activated, serves to rotate said separator against said biasing means to thereby retract said separator away from said take-up path.

5. In an image forming apparatus for forming a visible image by superposing an image receiving sheet on a light receiving sheet, said light receiving sheet having a selectively hardened image formed thereon and pressing said sheets together to transfer said selectively hardened image onto said image receiving sheet, said apparatus including take-up means for causing said light receiving sheet to travel along a take-up path to be wound up around a take-up shaft, the improvement wherein said image forming apparatus further includes
    a separator having a wedge-like front end and being rotatably supported around a fixed axis,
    a biasing means for normally keeping said separator in a sheet-separating position on said take-up path for separating said image receiving sheet from said light receiving sheet after said image is transferred, and
    retracting means for retracting said separator from said take-up path when said front end is not serving to separate said sheets.

6. The image forming apparatus of claim 5 further including a control unit which activates said retracting means after ascertaining that a new cartridge containing unused light receiving sheet has been inserted into said apparatus.

7. The image forming apparatus of claim 5 wherein said retracting means include a solenoid which, when activated, serves to rotate said separator against said biasing means to thereby retract said separator away from said take-up path.